(12) United States Patent
Chiu (10) Patent No.: US 6,573,669 B1
(45) Date of Patent: Jun. 3, 2003

(54) CATHODE RAY TUBE DRIVER CIRCUIT WITH FREQUENCY COMPENSATION WITHOUT PROVIDING A LEAKAGE PATH FOR CATHODE CURRENT

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/974,564

(22) Filed: Oct. 9, 2001

(51) Int. Cl.[7] ............................. H04N 5/68; H04N 9/72
(52) U.S. Cl. ........................................ 315/388; 315/396
(58) Field of Search ............................... 315/386–389, 315/373, 396, 397

(56) References Cited

U.S. PATENT DOCUMENTS 5,578,966 A * 11/1996 Mills .......................... 330/263
5,894,327 A * 4/1999 Griepentrog ................. 315/388

* cited by examiner

Primary Examiner—Don Wong
Assistant Examiner—Wilson Lee
(74) Attorney, Agent, or Firm—Wagner, Murabito & Hao LLP (57) ABSTRACT

A circuit for driving a cathode ray tube (CRT) with frequency compensation. Specifically, the present invention discloses a CRT driver circuit comprising a cascode gain stage for amplifying an input voltage. A cascode push-pull output stage generates a video output signal from the input voltage at an output node. The video output signal drives a coupled CRT and corresponding CRT cathode. A biasing node within the push-pull output stage has a biasing voltage that is always higher than the output voltage of the video output signal. Electrodes of a vertical-integrated PNP transistor are adaptively coupled to the biasing node, output node, and the cascode gain stage to provide two parallel feedback paths for frequency compensation without any cathode current leakage. As such, a current detection circuit accurately measures cathode current from a CRT that is driven by the CRT driver circuit.

24 Claims, 6 Drawing Sheets

CATHODE RAY TUBE DRIVER CIRCUIT WITH FREQUENCY COMPENSATION WITHOUT PROVIDING A LEAKAGE PATH FOR CATHODE CURRENT

BACKGROUND OF THE INVENTION

1. Field of the Invention

The present invention relates to the field of cathode ray tube drivers. More specifically, the present invention relates to the field of cathode ray tub driver circuits with cathode frequency compensation and cathode current detection for high resolution display applications.

2. Related Art

Digital television formats such as high definition television (HDTV) and enhanced definition television (EDTV) provides for increased resolution in the television picture. The improvements in picture quality is accomplished via a new broadcasting standard that implements a wider bandwidth and higher frequencies than previously required for use with conventional television units. As such, supporting circuitry in televisions must be adapted to perform under the new broadcasting standard, such as the one supporting HDTV.

One component needing to adapt to the higher bandwidth and higher frequencies of the digital television formats is the cathode ray tube (CRT) driver used for amplifying a video input signal and generating a video output signal for driving a cathode in a television CRT.

In the past, CRT drivers for conventional televisions consisted of discrete circuits capable of easily handling the high power supplies necessary to run conventional CRTs. The discrete circuits also could easily handle the lower frequencies and lower bandwidths of the analog broadcasting signal. However, the discrete circuits could not handle the higher operating frequencies, higher speeds, and wider bandwidths of high resolution televisions. These high resolution televisions (e.g., HDTV and EDTV) are capable of displaying digitally broadcasted signals. As such, new CRT drivers implemented on integrated circuit boards have been developed that are capable of handling the higher operating frequencies, higher speeds, and wider bandwidths required by the high resolution televisions.

In addition, it is desirous for the new CRT driver circuits implemented on an integrated circuit to have cathode current detection. Over time, the cathode in the electron gun of the CRT will deteriorate. This deterioration leads to a fluctuation in the cathode current which leads to a deterioration in color on the television display. The ability to measure the cathode current allows for recalibration of the electron gun in the CRT so that the magnitude of current generated by the cathode, in response to a test input signal, is consistent over time.

Furthermore, it is desirous to speed up the transient response, or the slew rate, of the amplifier contained in the CRT driver circuit. Frequency compensation is one method for increasing speed. By including frequency compensation, the speed of the CRT driver circuit during the transient response periods is markedly increased without increasing power consumption.

Figure 1:
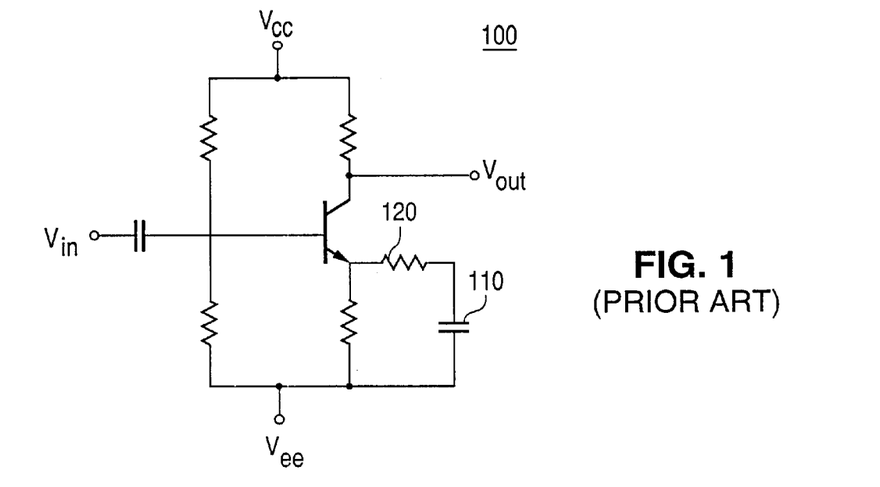
FIG. 1 is schematic diagram of an exemplary high frequency amplifier circuit with frequency compensation that comprising discrete components that is incapable of handling the higher operating frequency, higher speed, and wider bandwidth typically required by high resolution televisions.

Prior Art FIG. 1 shows a typical high frequency amplifier circuit 100 with frequency response using a feedback path consisting of a bypass capacitor 110 and resistor 120. Although circuit 100 provides for increased transient response, the discrete components (e.g. the capacitor 110 and resistor 120) required in circuit 100 are incapable of handling the higher operating frequencies, higher speeds, and wider bandwidths typically required by the high resolution televisions. Furthermore, because of their size and structure, the discrete components cannot be implemented in an integrated circuit, as is typically required by high resolution televisions.

Further, CRT driver circuits implemented on integrated circuits in the prior art that included frequency compensation were also incapable of accurately measuring the cathode current from a CRT that was driven by the CRT driver circuit. For example, frequency compensation circuits implemented on integrated circuits typically provided for a leakage path that allowed a cathode current to leak to ground through the frequency compensation circuit. To compound matters, the leakage current would be of the same magnitude as the cathode current. As such, the CRT cathode current being leaked could not be ignored, and any measurement of the cathode current would not reflect the current lost through the leakage path. Thus, any measurement would not be a true measurement of the cathode current coming from the CRT.

Thus, there is a need for CRT driver circuits that can accurately measure cathode current from a CRT with frequency compensation capabilities.

SUMMARY OF THE INVENTION

Accordingly, a cathode ray tube (CRT) driver circuit suitable for high resolution display applications with frequency compensation is described. Additionally, the present invention provides the above accomplishment and is further capable of accurately measuring cathode current from the CRT.

Specifically, the present invention discloses a CRT driver circuit comprising an input buffer stage, a cascode gain stage, as well as a cascode push-pull output stage that is biased as a Class B configuration for driving a CRT cathode. At an output node, the cascode push-pull output stage generates a video output signal in response to an input voltage for driving a coupled CRT and corresponding CRT cathode.

A biasing node within the push-pull output stage has a biasing voltage that is always higher than the output voltage of the video output signal. A frequency compensation circuit is comprised of a vertical-integrated PNP transistor that is adaptively coupled to the biasing node, the output node, and the cascode gain stage.

Electrodes of the vertical-integrated PNP bi-polar junction transistor (BJT) are adaptively coupled to the biasing node, output node, and the cascode gain stage to provide two parallel feedback paths for frequency compensation. In addition, the N-P junction capacitances within the PNP BJT are reversed biased so that any cathode current leakage through the PNP BJT is effectively eliminated. As such, a current detection circuit accurately measures cathode current from a CRT without any loss in cathode current through the frequency compensation circuit.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

PRIOR ART

DETAILED DESCRIPTION OF THE INVENTION

Reference will now be made in detail to the preferred embodiments of the present invention, a cathode ray tube (CRT) driver circuit suitable for high resolution display applications with frequency compensation and cathode current detection capabilities, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, a cathode ray tube (CRT) driver circuit that includes frequency compensation and measures cathode current from a CRT is described. The present invention provides for a CRT driver circuit that is capable of increasing the speed of the transient response of a CRT driver circuit that drives high resolution televisions. Additionally, the present invention is further capable of accurately measuring cathode current from the CRT contained within the high resolution television.

Figure 2:
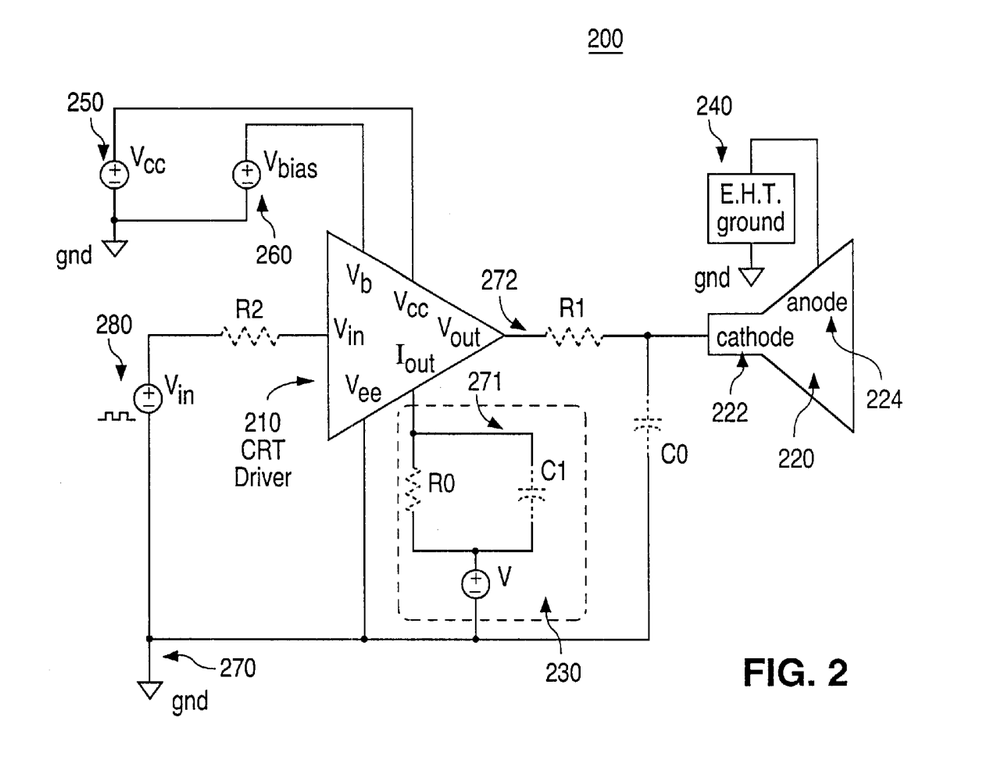
FIG. 2 is a block diagram of a cathode ray tube driver block with cathode current detection, in accordance with one embodiment of the present invention.

FIG. 2 is a schematic diagram of a television display system 200 showing a CRT driver block 210 driving a CRT block 220, in accordance with one embodiment of the present invention. The CRT driver block 210 amplifies a video input signal (Vin) from the input source 280 and outputs a video output signal (Vout) for driving a cathode electrode in the CRT block 220. In addition, the CRT driver block 210 includes a feedback circuit that provides for frequency compensation. The CRT block 220 displays images on a screen in response to a video signal (Vin) that is converted from a broadcast signal transmitted in a digital format, such as high definition television (HDTV) and enhanced definition television (EDTV).

The CRT driver block 210 is a dual supply amplifier. A high voltage supply (Vcc) 250 is coupled to the CRT driver block 210. Also a low voltage supply (Vb) 260 for biasing the amplifier in the CRT driver block 210 is coupled to block 210. It is appreciated that for a color system, there are three driver amplifiers (e.g., for driving red, green, and blue).

An extremely high voltage supply (e.g., 24,000 Volts) supplies the current at the anode 224 for the CRT block 220. An output at node 271 provides means for measuring the cathode current at the cathode electrode 222 of the CRT block 220. A current measuring block 230 measures the current from the potential created at the CRT driver current output at node 271.

Node 270 represents ground (Vee) for the circuit 200. The ground (Vee) sets the voltage swing for the output (Vout) at node 272 of the CRT driver block 210. As such, the voltage swing for Vout at node 272 is between the high supply voltage (Vcc) and ground (Vee).

Although embodiments of the present invention are discussed using a CRT for a HDTV, it is appreciated that other embodiments are well suited to using a CRT for any high resolution television displaying broadcast signals that are digitally formatted (e.g., EDTV).

The CRT driver block 210 is implemented as an integrated circuit to reduce the internal stray capacitance and external PCB trace capacitance effects. Smaller components inherently have less stray capacitance than its discrete counterparts. Implementing the CRT driver block as an integrated circuit allows for the CRT driver block to effectively operate under the higher frequencies, higher operating speeds, and wider bandwidths as required by the digital television formats (e.g., HDTV and EDTV) while limiting the negative effects of stray and PCB trace capacitance, such as reduced resolution.

Figure 3:
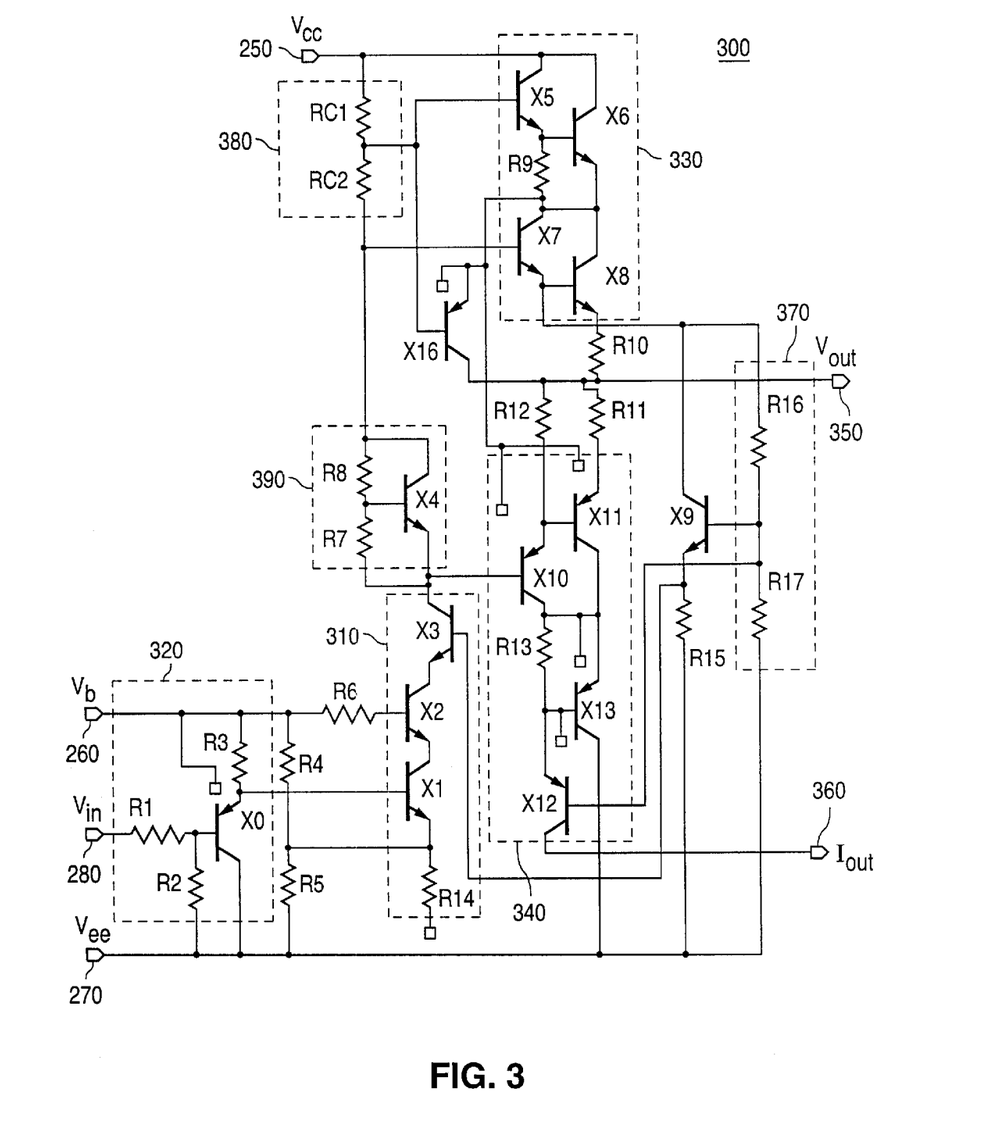
FIG. 3 is a schematic diagram of a cathode ray tube driver circuit without frequency compensation.

FIG. 3 is a schematic diagram of an exemplary CRT driver circuit 300 with cathode current detection capabilities, in accordance with one embodiment of the present invention. The CRT driver circuit 300 can be a simplified circuit diagram of the CRT driver block 210 of FIG. 2, in one embodiment. In addition, the CRT driver circuit 300 does not include any frequency compensation capabilities, and is provided solely for the purposes of providing a performance baseline.

The high speed amplifier block 310 is configured as a cascode amplifier with three transistors, in accordance with one embodiment of the present invention. The fixed gain cascode amplifier is capable of higher operating speeds allowing it to operate at high supply voltages. The gain of the amplifier block 310 can be approximately calculated as follows: (RC1+RC2)/R5. The high speed amplifier block 310 is comprised of an NPN common emitter transistor X1 connected in cascode with a common base NPN transistor X2 that is further connected in cascode with a common base NPN transistor X3. A fixed base low voltage bias (Vb) is provided at node 260 to the base of the transistor X2 through a resistor R6.

The video input signal at Vin pin 280 is buffered at the input buffer stage 320, in accordance with one embodiment of the present invention. The input buffer stage 320 is comprised of a PNP emitter follower transistor X0 to isolate the gain amplifier block 310 from external circuitry. The video input signal at Vin pin 280 is connected to the base of the transistor X0 through a resistor R1. The collector of transistor X0 is coupled to ground (Vee). The emitter of the transistor X0 is coupled to the base of transistor X1 in the amplifier block 310 and to the low voltage supply (Vb) at node 260 through a resistor R3.

In order to make a high speed amplifier for HDTV applications, many Darlington transistor amplifier configurations are used so as to achieve better output current driving capability despite the external resistive and capacitive loads (e.g., the CRT), as is shown in FIG. 3. The CRT driver circuit 300 implements a push-pull configuration using an upper output stage 330 of Darlington configured NPN transistors, and a lower output stage 340 of Darlington configured PNP transistors, in accordance with one embodiment of the present invention.

In the lower stage 340, two pairs of Darlington configured transistors are coupled in series. A first pair of Darlington configured transistors comprises a prestage transistor X10 and an output transistor X11. A second pair of Darlington configured transistors comprises a prestage transistor X12 and an output transistor X13. The second pair of transistors is coupled in series with the first pair of transistors. The lower stage 340 is comprised of two pairs of Darlington configured transistors in order to achieve high operating voltage (e.g., Vcc at node 250). In addition, in one embodiment, the lower stage 340 of CRT driver circuit 300 is comprised entirely of PNP transistors as one component of the push-pull configuration of the CRT driver circuit 300.

A lower prestage amplifier in the lower stage 340 is comprised of the two lower prestage transistors, X12 and X10 coupled in series. The output of the high speed amplifier block 310 at the collector of transistor X3 is coupled to the base of transistor X10 in the lower prestage of transistors. A CRT driver output or video output signal (Vout) is coupled to the Vout pin 350 through a resistor R12. Vout pin 350 is coupled to a cathode electrode of a CRT to allow the Vout signal to drive the cathode electrode.

A lower output amplifier stage is comprised of the two lower output transistors X11 and X13 coupled in series. The lower output amplifier is biased as a Class B amplifier. As such, no quiescent collector currents exist. Hence, during static periods of the video input signal, the current throughout the lower stage 340 of Darlington configured transistors is comprised essentially of the cathode current from the cathode electrode of the coupled CRT which is externally connected at the Vout pin 350.

The lower output amplifier stage only turns on during the transient periods of the video input signal. The transistors X11 and X13 turn on when the output voltage swings from high to low. This is in contrast to the upper output amplifier stage as will be discussed later.

The collector electrode at transistor X12 provides a cathode current output at Iout pin 360. Since the output transistors X11 and X13 in the lower output amplifier stage are turned off during static periods of the video input signal, the current measured at Iout pin 360 is essentially that of the cathode current measured at the Vout pin 350 with slight deviation for the beta value losses in output transistors X10 and X12.

For purposes of calibrating the electron gun in the CRT, a video test signal is inputted at the input node 280 that is essentially a DC input. The extremely long wavelength allows for a static signal to traverse across one scan line of the display. The cathode current measured at the Iout pin 360 is highly accurate, as the only conductive path from the cathode electrode coupled to output pin 350 is through the lower prestage amplifiers consisting of transistors X10 and X12.

In the upper stage 330, two pairs of Darlington configured transistors are coupled in series. A third pair of Darlington configured transistors comprises a prestage transistor X5 and an output transistor X6. A fourth pair of Darlington configured transistors comprises a prestage transistor X7 and an output transistor X8. The upper stage 330 is comprised of two pairs of Darlington configured transistors in order to achieve high operating voltage (e.g., Vcc at node 250).

An upper prestage amplifier stage is comprised of the two upper prestage transistors, X5 and X7 coupled in series. In one embodiment, the upper prestage transistors in the upper stage 330 are comprised of NPN transistors to complete the complementary push-pull amplifier configuration.

An upper output amplifier stage is comprised of the two upper output transistors X6 and X8 coupled in series. The upper output amplifier is also biased as a Class B amplifier. As such, no quiescent collector currents exist. The upper output amplifier only turns on during the transient periods of the video input signal (Vin). The transistors X6 and X8 turn on when the output voltage swings from low to high, which is in contrast to the lower output amplifier stage.

Thus, the Class B amplifiers in the upper and lower output amplifiers allow for the CRT driver circuit 300 to charge and discharge the external capacitances during both the falling and rising edges of the voltage from the video input signal. As such, the Class B amplifiers in the upper and lower output amplifier stages increase the operating speed of the CRT driver circuit 300 in order to run at the higher video signal frequencies of the digital broadcasting formats.

The high voltage supply (Vcc) at node 250 is coupled to both the collector electrodes of transistors X5 and X6 in the third pair of Darlington configured transistors in the upper stage 330 of FIG. 3.

Biasing of the upper output amplifier and the lower output amplifier to Class B is controlled by the collector-to-emitter voltage of transistor X4 in the diode multiplier block 390, in accordance with one embodiment of the present invention. This collector-to-emitter voltage is approximately no more than 1 volt and biases the output transistors X6, X8, X11 and X13 so that the upper and lower output amplifiers are ready to turn on in their respective transient periods of the video input cycles.

Continuing with FIG. 3, the upper prestage amplifier comprised of transistors X5 and X7 also drive a voltage divider block 370. The voltage divider block 370 splits the high supply voltage (Vcc) at node 250 between the transistors X10 and X12 in the lower prestage amplifier. This allows the CRT driver circuit 300 to operate at much higher voltages. In one embodiment, the voltage divider 370 approximately splits the high voltage supply (Vcc) equally between the transistors X10 and X12.

Furthermore, a voltage divider block 380 splits the high voltage supply (Vcc) at node 250 between the transistors X5 and X7 in the upper prestage amplifier. This also allows the CRT driver circuit 300 to operate at much higher voltages as required by the digital formatted televisions, such as HDTVs. In one embodiment, the voltage divider 380 approximately splits the high voltage supply (Vcc) equally between the transistors X5 and X7.

In one embodiment, the resistors RC1 and RC2, in voltage divider block 380, and R16 and R17 in voltage divider block 370, are representative of resistors as described in the U.S. Pat. No. 5,977,610 by the same inventor, titled "Integrated Circuit Having Resistor Formed Over Multiple Tubs of Semiconductor Material."

Although embodiments of the present invention are discussed using NPN and PNP bipolar junction transistors (BJTs), it is appreciated that other embodiments are well suited to using other transistors suitable for amplifying a signal (e.g., MOSFETS, JFETS, etc.).

Figure 4A:
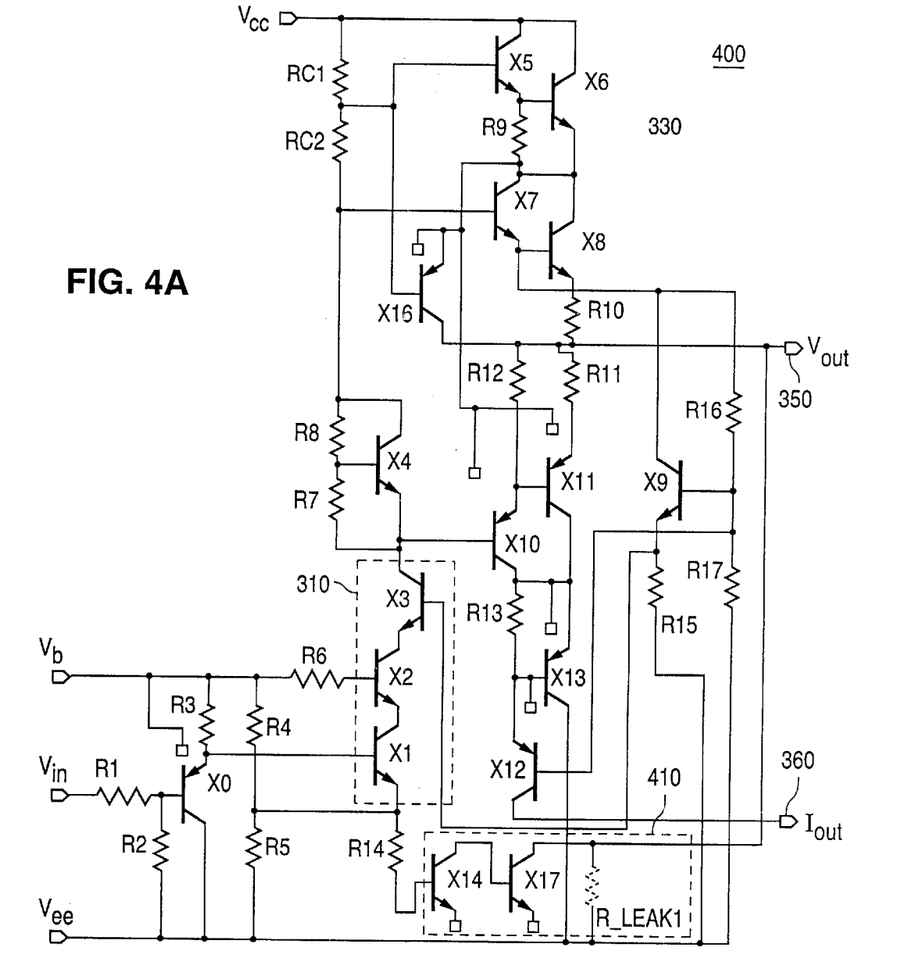
FIG. 4A is a schematic diagram of a cathode ray tube driver circuit with frequency compensation that has a cathode current leakage path.

FIG. 4A is a schematic diagram of an exemplary CRT driver circuit 400 with cathode current detection and frequency compensation capabilities, in accordance with one embodiment of the present invention. In one embodiment, circuit 400 is essentially circuit 300 with a frequency compensation circuit 410 included. Although circuit 400 provides an increase in the speed of the transient response times of circuit 400 in comparison to circuit 300, the frequency compensation circuit 410 provides a cathode current leakage path through the transistor X17. This detrimentally alters the cathode current measured at the Iout pin 360 as will be shown later.

In one embodiment of the present invention, the frequency compensation circuit 410 as illustrated in circuit 400 includes an NPN transistor X17 coupled to another NPN transistor X14. The frequency compensation circuit provides positive feedback between the output voltage pin (Vout) 350 and the high speed amplifier block 310 that acts as a cascode gain stage that can be implemented on an integrated circuit.

Figure 4B:
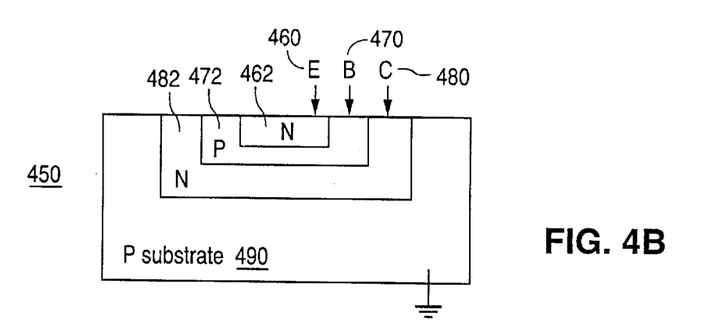
FIG. 4B is a diagram of an NPN bi-polar junction transistor used for frequency compensation in the CRT driver circuit of FIG. 4A that has a cathode current leakage path through the NPN transistor.

FIG. 4B is a diagram 450 of the NPN transistor X17 that provides frequency compensation. The diagram 450 illustrates the electrodes of the NPN transistor X17. For example, the emitter electrode 460 is coupled to the N-region 462 in the transistor X17. The base electrode 470 is coupled to the P-region 472 in the transistor X17. Also, the collector electrode 480 is coupled to another N-region 482 in the transistor X17. The N-region 482 is built on a P-substrate 490 that is coupled to ground.

Referring back to FIG. 4A, the emitter electrode 460 is left floating and is not used since the frequency compensation circuit 410 is mainly concerned with providing depletion junction capacitances from the NPN transistors X17 and X14. For example, in transistor X17, the collector to base region N-P junction capacitance provides for frequency compensation. In transistor X14, the collector to base region N-P junction capacitance provides also continues the feedback path for frequency compensation. Also, the base electrode 470 is coupled to the collector electrode of the NPN transistor X14. The collector electrode 480 is coupled to the Vout pin 350 to complete the feedback path.

The addition of transistor X14, effectively doubles the operating voltage of circuit 400 by increasing the breakdown voltage of the frequency compensation circuit 410. Starting from the collector of transistor X17 and moving towards transistor X14, the frequency compensation circuit 410 comprises two collector-base junction capacitors having an N-P-N-P structure.

However, circuit 400 is prone to cathode current leakage through the transistor X17. Because the collector electrode 480 is coupled to the Vout pin 350, the potential across the N-region 482 associated with the collector electrode 480 can overcome the reverse bias between the N-region 482 and the P-substrate 490 depending on production quality and limitations. As a result, the transistor X17 provides a leakage path for cathode current through the transistor X17 in the frequency compensation circuit 410. The circuit 400 is sensitive to cathode current leakage through the transistor X17. The resistor R-leak1 in circuit 400 represents the portion of cathode current being leaked through the transistor X17.

The cathode current that leaks through the leakage path through transistor X17 and is of the same magnitude as found in the cathode current coming from the CRT driven by the CRT driver circuit 400 and substantial enough to affect the measured current at the Iout pin 360. As such, the measured current through the Iout pin 360 does not accurately represent the cathode current from the CRT.

Figure 5A:
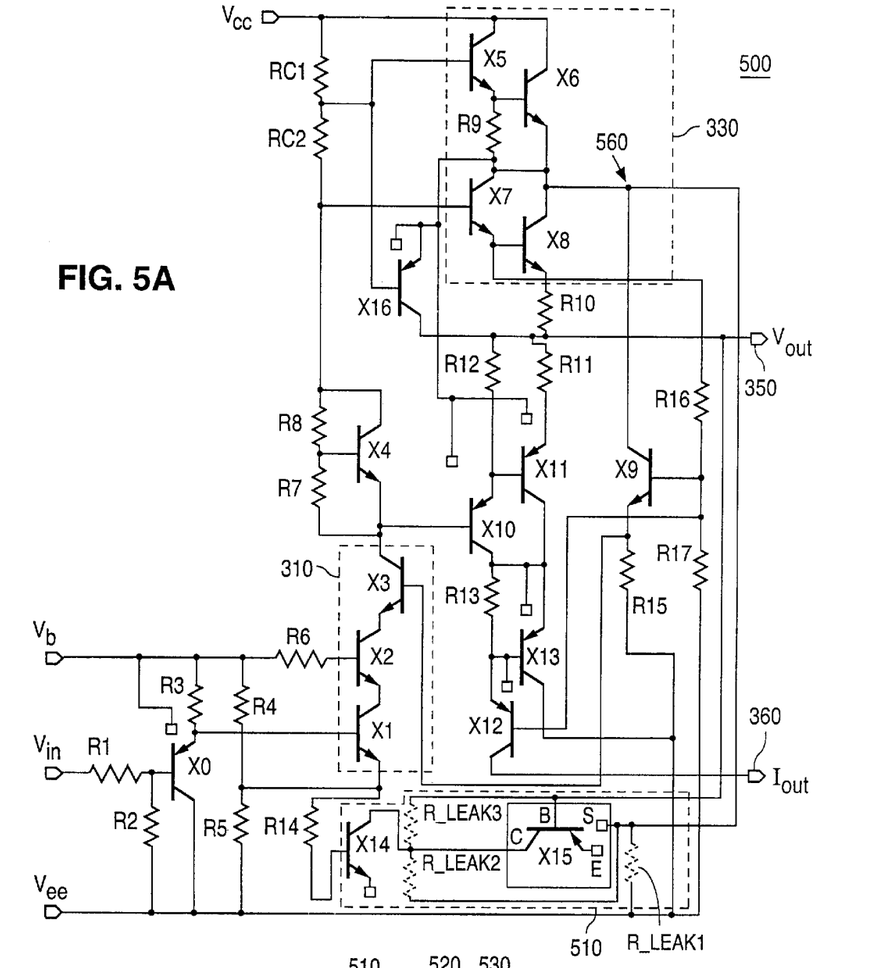
FIG. 5A is a schematic diagram of a cathode ray tube driver circuit with frequency compensation that prevents any cathode current leakage, and is capable of accurately measuring the cathode current from a CRT, in accordance with one embodiment of the present invention.

FIG. 5A is a schematic diagram of an exemplary CRT driver circuit 400 with cathode current detection and frequency compensation capabilities, in accordance with one embodiment of the present invention. In the present embodiment, circuit 500 is essentially circuit 300 with a frequency compensation circuit 510 included. In addition, circuit 400 provides an increase in the speed of the transient response times of circuit 400 in comparison to circuit 300 without providing for any cathode current leakage paths through the frequency compensation circuit 510. As such, the cathode current measured at the Iout pin 360 is accurately measured, as will be shown later.

The frequency compensation circuit 510 as illustrated in circuit 500 includes a vertical-integrated PNP transistor X15. The frequency compensation circuit 510 provides positive feedback between the output voltage pin (Vout) 350 and the high speed amplifier block 310 that acts as a cascode gain stage that can be implemented on an integrated circuit.

In another embodiment of the present invention, the PNP transistor X15 is coupled to an NPN transistor X14 that is then coupled to the high speed amplifier block 310. The addition of the NPN transistor X14 effectively increases the operating voltage of the CRT driver circuit 500 by increasing the breakdown voltage of the frequency compensation circuit 510.

Figure 5B:
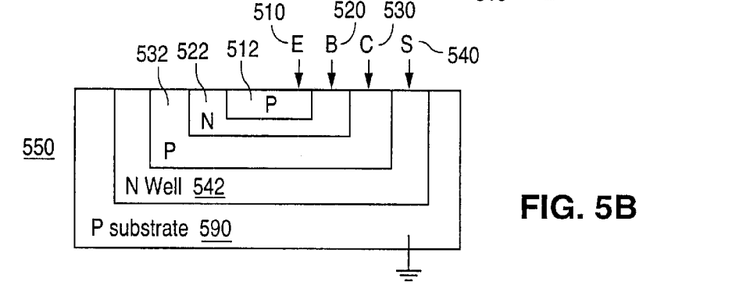
FIG. 5B is a diagram of a vertical-integrated PNP bi-polar junction transistor used for frequency compensation in the CRT driver circuit of FIG. 5A that prevents any cathode current leakage through the PNP transistor.

FIG. 5B is a diagram 550 of the PNP transistor X15 that provides frequency compensation. The diagram 550 illustrates the electrodes of the PNP transistor X15. For example, the emitter electrode 510 is coupled to a P-region 512 in the transistor X15. The base electrode 520 is coupled to an N-region 522 in the transistor X15. The collector electrode 530 is coupled to another P-region 532 in the transistor X15. The s-electrode 540 is coupled to and implemented within an N-well 542. The N-well 542 is built on a P-substrate 590 that is coupled to ground.

Referring back to FIG. 5A, the emitter electrode 510 is left floating and is not used since the frequency compensation circuit 410 is mainly concerned with providing depletion junction capacitances from the PNP transistor X15. In the vertical-integrated PNP transistor X15, the base electrode 520 is coupled to the Vout pin 350. The collector electrode 530 is coupled to the collector pin of the transistor X14.

The s-electrode 540 is coupled to a biasing node 560 that is located in the upper output stage 330. In one embodiment of the present invention, the biasing node 560 is coupled to the emitter of transistor X6. In another embodiment, when RC1 equals RC2, the voltage potential of the biasing node 560 is approximated by the following equation:

Voltage of node 560=1/2(Vcc+Vout)

The important feature of the biasing node 560 is that the voltage associated with the biasing node 560 swings in unison with the output voltage at the Vout pin 350. As such, the voltage at the biasing node 560 is always greater than the output voltage at the Vout pin 350.

The frequency compensation circuit 510 prevents cathode current leakage through the transistor X15 because the potential at the s-electrode 540 is always greater than the potential at the base electrode 520. As such, the N-well region 542 provides a shield against cathode current leakage from the base (N-region 522) to the P-substrate 590.

The transistor X15 may have some inherent leakage incurred during production. For example, R-leak3 is representative of the base/collector (N-region 522/P-region 532) junction current leakage, and R-leak2 is representative of the collector (P-region 532)/N-well 542 junction current leakage. However, the potential at the N-well 542 continues to shield the p-substrate 590 from any cathode current leakage.

On the other hand, R-leak1 is representative of the current leakage through the N-well 542/P-substrate 590 junction. While there may be some leakage in current between the N-well 542 and the P-substrate 590, this current is not from the cathode current and will not affect the measurement of the cathode current at the Iout pin 360.

In one embodiment of the present invention, the transistor X15 has two positive feedback paths in the peaking network that provides frequency compensation. The collector P-region 532 is sandwiched between two parallel positive feedback paths. In the first path, the base (N-region 522) to collector (P-region 532) junction capacitance provides frequency compensation from the Vout pin 350 to the cascode gain stage 310 via the transistor X14. In the second path, the N-well 542 to collector (P-region 532) junction capacitance provides frequency compensation from the voltage potential at the biasing node 560 to the cascode gain stage 310 via the transistor X14.

The addition of transistor X14 in both the first and second feedback paths effectively doubles the operating voltage of circuit 500 by increasing the breakdown voltage of the frequency compensation circuit 510, in accordance with one embodiment of the present invention. In both feedback paths, the junction capacitors in series have the same N-P-N-P structure as in the frequency compensation circuit 400. In the first feedback path, starting from the base electrode 520 of transistor X15 and moving towards transistor X14, two junction capacitors having an N-P-N-P structure are formed. In the second feedback path, starting from the N-well 540 of the transistor X15 and moving towards transistor X14, two junction capacitors having an N-P-N-P structure are also formed.

As an added benefit, since there are two paths for frequency compensation, the transistor X15 can be smaller than the transistor X17 in circuit 400, and still provide nearly the same performance without any cathode current leakage, in one embodiment.

Figure 6:
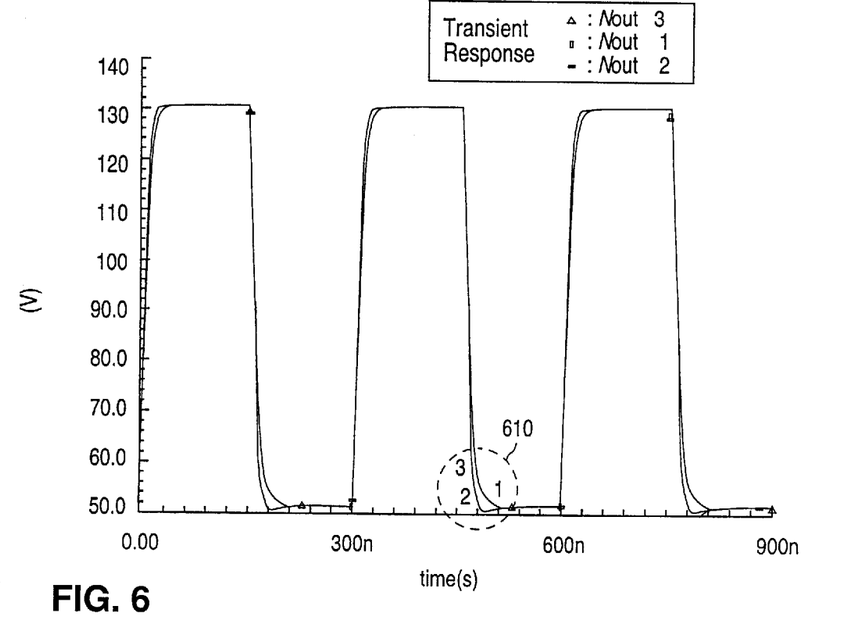
FIG. 6 is a graphical chart comparing the output potential of the cathode ray tube driver circuit of FIG. 5A against the driver circuits of FIGS. 3 and 4A as a function of time, in response to a square wave input potential, in accordance with one embodiment of the present invention.

FIG. 6 is a graphical chart illustrating the output potentials of the Vout pin 350 of the CRT driver circuits 300, 400, and 500 in FIGS. 3, 4A, and 5A as a function of time, in accordance with one embodiment of the present invention. The output potential is in response to a square wave input potential (Vin) having a period of 300 nsec. FIG. 6 shows the CRT driver circuit 500 has rise time and fall time values for a high speed amplifier capable of driving a CRT for a digitally formatted television, such as an HDTV, EDTV, etc.

Referring now to highlighted region 610, when comparing the speeds of the transient responses of each of the circuits, 300, 400, and 500, the waveform (#1) for the circuit 300 without any frequency response is the slowest. On the other hand, the waveforms for circuits 400 (waveform #2) and 500 waveform #3) that have frequency response have faster transient responses than for the circuit 300. The response time for circuits 500 is slightly slower than the response time for circuit 400, and are nearly indistinguishable in FIG. 6.

Figure 7A:
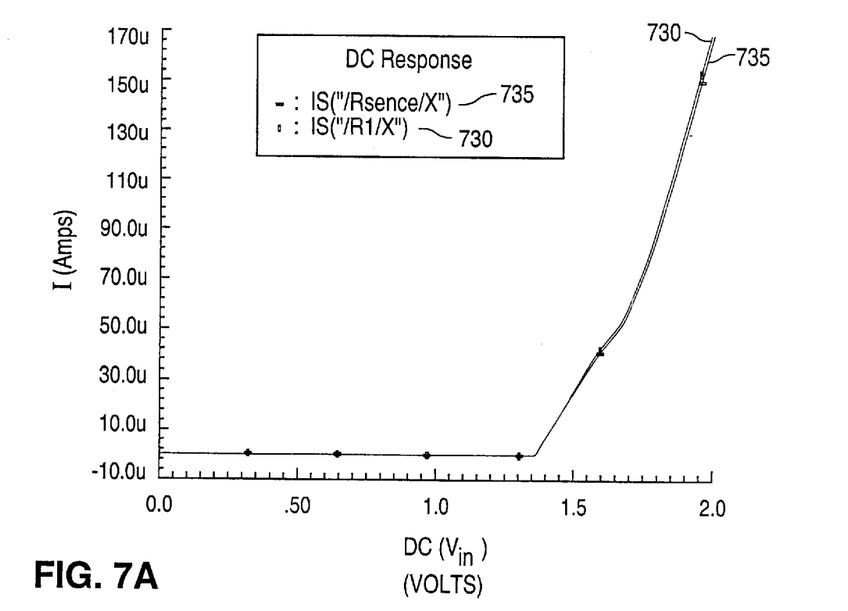
FIG. 7A is a graphical chart illustrating the output current of the cathode ray tube driver circuit of FIG. 3 as a function of a DC input potential comparing cathode current with the measured current.
Figure 7B:
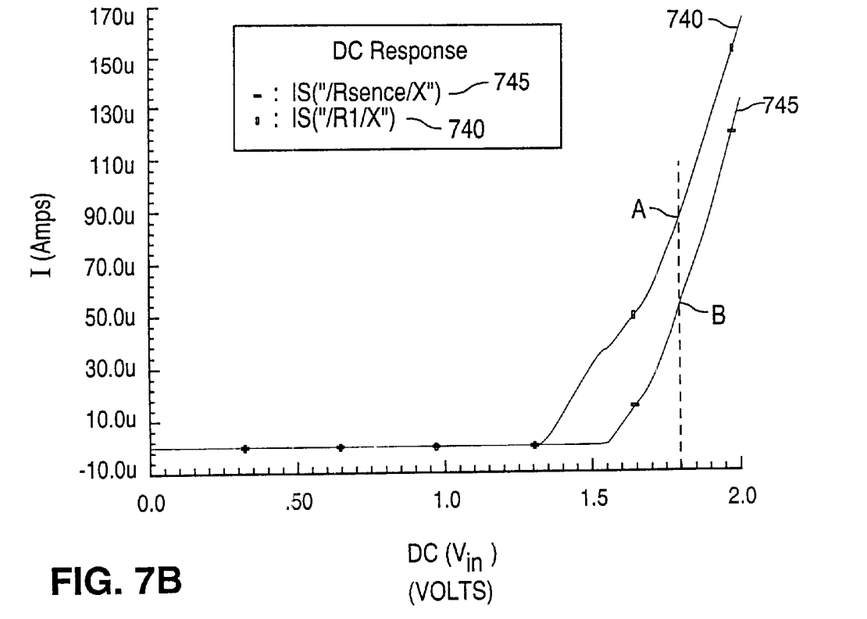
FIG. 7B is a graphical chart illustrating the output current of the cathode ray tube driver circuit of FIG. 4A as a function of a DC input potential comparing cathode current with the measured current.
Figure 7C:
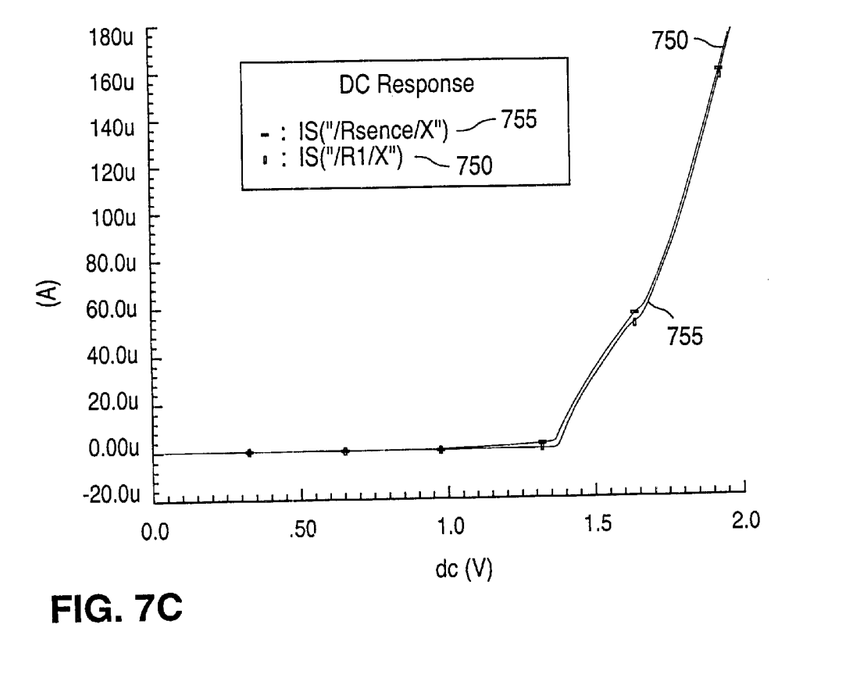
FIG. 7C is a graphical chart illustrating the output current of the cathode ray tube driver circuit of FIG. 5A as a function of a DC input potential comparing cathode current with the measured current, in accordance with one embodiment of the present invention.

FIGS. 7A, 7B, and 7C are graphical charts illustrating the output current, a cathode current, of the cathode ray tube driver circuits 300, 400, and 500, respectively, as a function of a DC input potential, in accordance with one embodiment of the present invention. Each of the FIGS. 7A, 7B, and 7C compare the cathode current with the measured current at the Iout pin 360.

Referring now to FIG. 7A, the measured current at both the Iout pin 360 and the cathode electrode (Vout pin 350) are nearly identical for CRT driver circuit 300. Throughout the entire span of input voltage for FIG. 7A, the curve 730, representing the cathode current at Vout pin 350, and the curve 735, representing the measured current at the Iout pin 360, are nearly identical. The variation in current is due to the Beta values of the lower prestage transistors X10 and X12. The CRT driver circuit 300 provides for accurate readings of cathode current from a coupled CRT electrode of a CRT with high resolution display capabilities. However, the CRT driver circuit 300 is slow in comparison to circuits with frequency compensation.

Referring now to FIG. 7B, the cathode current of the CRT driver circuit 400 at the Vout pin 350 is represented by curve 740. Similarly, the measured current at the Iout pin 360 is represented by curve 745. As shown in FIG. 7B, the two curves 740 and 745 are not identical and illustrate a leakage in the cathode current through the frequency compensation circuit 410. Specifically, at a DC input voltage of 1.8 volts, the current measured at the Vout pin 350 at point A is approximately 90 microamps. Similarly, the current at point B as measured at the Iout pin 360 is approximately 54 microamps. FIG. 7B shows a cathode current loss between the Vout pin 350 and the Iout pin 360 of approximately 36 microamps. While the transient response of circuit 400 is faster than that of circuit 300, having no frequency response, the cathode current detection capability of circuit 400 is unacceptable for accurately measuring cathode current.

Referring now to FIG. 7C, the cathode current of the CRT driver circuit 500 at the Vout pin 350 is represented by curve 750. Similarly, the measured current at the Iout pin 360 is represented by curve 755. As shown in FIG. 7C, the two curves 750 and 755 are nearly identical throughout the span of input voltages and illustrate that there is no leakage in the cathode current through the frequency compensation circuit 510. FIG. 7C illustrates that the transient response of circuit 500 is faster than that of circuit 300, having no frequency response. In addition, FIG. 7C illustrates that the cathode current detection capability of circuit 500 accurately measures the cathode current at the Iout pin 360.

The preferred embodiment of the present invention, a cathode ray tube driver circuit with cathode detection capabilities and frequency compensation, is thus described. While the present invention has been described in particular embodiments, it should be appreciated that the present invention should not be construed as limited by such embodiments, but rather construed according to the below claims.

What is claimed is:

1. A cathode ray tube (CRT) driver circuit with frequency compensation and cathode current detection, comprising:

an input node for accepting an input voltage;

an cascode gain stage coupled to said input node for amplifying said input voltage;

a cascode push-pull output stage coupled to said cascode gain stage for generating a video output signal;

an output node coupled to said cascode push-pull output stage for presenting said video output signal to a coupled CRT cathode of a CRT;

a biasing node adaptively coupled within said cascode push-pull output stage that has a biasing voltage that is higher than an output voltage associated with said video output signal; and a frequency compensation circuit adaptively coupled to said biasing node and to said cascode gain stage for frequency compensation without providing a leakage path for a cathode current from said CRT cathode.

2. The CRT driver circuit as described in claim 1, wherein said frequency compensation circuit comprises:

a vertical-integrated PNP transistor adaptively coupled to said biasing node and to said cascode gain stage.

3. The CRT driver circuit as described in claim 1, wherein said frequency compensation circuit comprises:

a vertical-integrated PNP bi-polar junction transistor (BJT) adaptively coupled to said biasing node and to said cascode gain stage via an NPN BJT forming two N-P junction capacitors coupled in series.

4. The CRT driver circuit as described in claim 2, wherein said vertical-integrated PNP transistor is a bi-polar junction transistor comprising:

a collector electrode coupled to said cascode gain stage;

a base electrode coupled to said output node for forming a first feedback path; and an s-electrode coupled to said biasing node for forming a second feedback path in parallel to said first feedback path.

5. The CRT driver circuit as described in claim 1, wherein said biasing voltage is less than a static high voltage supply that is coupled to said cascode push-pull output stage.

6. The CRT driver circuit as described in claim 1, further comprising:

an input buffer stage coupled to said input node and to said cascode gain stage to isolate said cascode gain stage from external circuitry.

7. The CRT driver circuit as described in claim 1, further comprising:

a current detection circuit coupled to said cascode push-pull output stage for measuring said cathode current.

8. The CRT driver circuit as described in claim 1, wherein said CRT driver circuit is implemented in integrated circuit form.

9. The CRT driver circuit as described in claim 1, wherein said video output signal drives said CRT for a high definition television (HDTV).

10. The CRT driver circuit as described in claim 1, wherein said video output signal drives said CRT for a Enhanced Definition Television (EDTV).

11. A cathode ray tube (CRT) driver circuit with frequency compensation and cathode current detection, comprising:

an input node for accepting an input voltage;

an cascode gain stage coupled to said input node for amplifying said input voltage;

a cascode push-pull output stage coupled to said cascode gain stage for generating a video output signal;

an output node coupled to said cascode push-pull output stage for presenting said video output signal to a coupled CRT cathode of a CRT;

a biasing node adaptively coupled within said cascode push-pull output stage that has a biasing voltage that is higher than an output voltage associated with said video output signal; and a vertical-integrated PNP transistor adaptively coupled to said biasing node and to said cascode gain stage for frequency compensation without providing a leakage path for a cathode current from said CRT cathode.

12. The CRT driver circuit as described in claim 11, further comprising:

an NPN BJT adaptively coupled to said vertical-integrated PNP (BJT) and to said cascode gain stage to form two N-P junction capacitors coupled in series for frequency compensation for increasing breakdown voltage.

13. The CRT driver circuit as described in claim 12, wherein said vertical-integrated PNP transistor is a bi-polar junction transistor comprising:

a collector electrode coupled to said cascode gain stage;

a base electrode coupled to said output node for forming a first feedback path; and an s-electrode coupled to said biasing node for forming a second feedback path in parallel to said first feedback path.

14. The CRT driver circuit as described in claim 11, wherein said biasing voltage is less than a static high voltage supply that is coupled to said cascode push-pull output stage.

15. The CRT driver circuit as described in claim 11, further comprising:

a current detection circuit coupled to said cascode push-pull output stage for measuring said cathode current.

16. The CRT driver circuit as described in claim 11, wherein said cascode push-pull output stage comprises an upper output stage in a Darlington configuration and a lower output stage in said Darlington configuration that are coupled to said output node.

17. The CRT driver circuit as described in claim 11, wherein said CRT driver circuit is implemented in integrated circuit form.

18. A circuit with frequency compensation comprising:

a cathode ray tube (CRT) driver circuit with cathode current detection that drives a CRT;

a PNP bi-polar junction transistor (BJT) adaptively coupled to said CRT driver circuit for providing two parallel feedback paths with N-P junction capacitors for frequency compensation without providing a leakage path for a cathode current from said CRT.

19. The circuit with frequency compensation as described in claim 18, wherein said PNP BJT further comprises:

a P-type collector coupled to a gain stage in said CRT driver circuit;

an N-type base coupled to an output node in said CRT driver circuit and to said P-type collector for creating an N-P, base-to-collector junction capacitor that forms a first feedback path; and an N-type well coupled to said P-type collector and adaptively coupled to a biasing node located in said CRT driver circuit that has a biasing voltage that is higher than an output voltage at said output node for creating an N-P, N-well-to-collector junction capacitor that forms a second feedback path.

20. The circuit with frequency compensation as described in claim 18, further comprising:

an NPN BJT adaptively coupled to said PNP BJT and to a gain stage in said CRT driver circuit to create two N-P junction capacitors in series for doubling the voltage swing in said CRT driver circuit when providing frequency compensation.

21. The circuit with frequency compensation as described in claim 18, further comprising:

a current detection circuit coupled to a cascode push-pull output stage in said CRT driver circuit for measuring said cathode current.

22. The CRT driver circuit as described in claim 18, wherein said circuit with frequency compensation is implemented in integrated circuit form.

23. The CRT driver circuit as described in claim 18, wherein said video output signal drives said CRT for a high definition television (HDTV).

24. The CRT driver circuit as described in claim 18, wherein said video output signal drives said CRT for a Enhanced Definition Television (EDTV).

* * * * *